United States Patent [19]

Haddad et al.

[11] Patent Number: 4,992,840
[45] Date of Patent: Feb. 12, 1991

[54] CARBON DOPING MOSFET SUBSTRATE TO SUPPRESS HIT ELECTRON TRAPPING

[75] Inventors: Homayoon Haddad; Leonard Forbes; Wayne P. Richling, all of Corvallis, Oreg.

[73] Assignee: Hewlett-Packard Company, Palo Alto, Calif.

[21] Appl. No.: 412,067

[22] Filed: Sep. 21, 1989

[51] Int. Cl.$^5$ .................. H01L 29/78; H01L 29/10; H01L 29/06
[52] U.S. Cl. .............................. 357/23.15; 357/23.3; 357/23.9; 357/23.12
[58] Field of Search .............. 357/23.15, 23.3, 23.12, 357/23.8, 23.13, 23.11, 23.4, 23.9

[56] References Cited

U.S. PATENT DOCUMENTS 4,636,834 1/1987 Shepard .................. 357/23.11

FOREIGN PATENT DOCUMENTS 56-125846 3/1980 Japan .

OTHER PUBLICATIONS

Sze, S. M., *Semiconductor Devices Physics and Technology*, 1985, pp. 318-319.
Chen, et al., "Suppression of Hot-Carrier Effects in Submicrometer CMOS Technology", IEEE Trans. on Elec. Dev., vol. 35, No. 12, pp. 2210-2219 (Dec. 1988).

*Primary Examiner*—Rolf Hille
*Assistant Examiner*—Roy K. Potter

[57] ABSTRACT

A MOSFET device having a near-micrometer or submicrometer channel length and designed to operated under conditions that cause generation of hot carriers is carbon doped in the silicon substrate at the gate oxide-silicon interface. The oxide-silicon interface can include hydrogen atoms. These atoms are mostly bonded to carbon atoms, more strongly than hydrogen bonds to silicon, so that hot carriers are less likely to dissociate the hydrogen atoms and form hot carrier trapping sites at the interface. Hot carrier aging is thus substantially reduced. This capability is particularly useful in submicrometer devices, avoiding need to reduce normal operating voltages.

13 Claims, 2 Drawing Sheets

CARBON DOPING MOSFET SUBSTRATE TO SUPPRESS HIT ELECTRON TRAPPING

BACKGROUND OF THE INVENTION

This invention relates to a semiconductor device fabrication method and device design for suppressing hot carrier effects in MOS integrated circuits and more particularly to a technique for minimizing process-related aging effects in short gate-length MOSFET devices.

The problems of hot carriers, device aging and reliability have been recognized as one of the major constraints in device scaling The injection of hot carriers generated by impact ionization in the high drain field region of near-micrometer and submicrometer MOSFET devices degrades the device characteristics. The usual MOSFET processes and device structures, having a gate oxide layer in contact with the silicon substrate over the channel as shown in FIG. 1, are susceptible to hot-carrier trapping at the oxide-silicon interface. The trapped carriers accumulate over time and gradually lead to a shift in threshold voltage of the device that can amount to several tenths of volts or more. This means that circuit design aspects that are affected by gate threshold voltage are susceptible to change over the usual lifetime of circuit usage. In practice, it means that circuits designed with such devices to very close tolerances and initially operative are likely to fail after some period of time. A recent article by Chen et al. entitled "Suppression of Hot-Carrier Effects in Submicrometer CMOS Technology," IEEE Transactions on Electron Devices, Vol. 35, No. 12, Dec. 1988, pages 2210–2219, surveys state-of-the-art approaches to dealing with the problems of hot-carrier aging.

Hot-carrier aging was virtually nonexistent in circuits of MOSFET devices with a gate length of several micrometers. It becomes noticeable as gate lengths shorten to below 2 micrometers and becomes severe at gate lengths of one micrometer and below. Hot carrier generation is caused principally by ionization impact of drain current carriers with the silicon substrate lattice structure in a high electric field. As devices are scaled to smaller size while maintaining a constant drain voltage $V_D$, the field strength increases. When field strength increases above about $10^5$ volt/cm., hot carriers unavoidably begin to be generated. One approach to managing hot carrier effects has been to reduce operating voltages for short gate integrated circuits. Commercial integrated circuit technology uses a standard 5 volts. Reductions to a range of 2.5–3 volts have been proposed to reduce the drain field in submicron circuit technologies. While providing some benefits, this approach leads to further problems of circuit compatibility, reduced performance, and reduced noise immunity. Ultimately, as devices continue to be scaled down, the high field problem returns.

Chen et al. discuss other approaches to controlling hot-carrier generation and injection, mostly involving positioning of current path and ionization region to minimize adverse effects. These approaches also are only stop-gap measures which will eventually fail as device sizes continue to be scaled down.

Processing aspects of hot-carrier aging are also considered by Chen et al. It is recognized as being desirable to reduce the number of hot-carrier trapping sites and that trapping at the oxide-silicon interface is the main cause of degradation. Countermeasures include forming and maintaining a high quality oxide layer and seeking to reduce Si—H bond breakage during hot-carrier injection. The latter approach proposes to reduce the hydrogen content of the device structure.

Hydrogen has long been used to fill dangling bonds, forming Si—H at the oxide-silicon interface to minimize the interface states. The Si—H bond can be easily broken by injected hot carriers, however, creating a trapped carrier at the site of the broken bond. It has been suggested to substitute fluorine for hydrogen, or to sinter the devices in a nitrogen atmosphere instead of hydrogen. Chen et al conclude, however, that it will become necessary to scale down operating voltage to 3.3 volts or below for submicrometer devices.

Another solution to the dangling bond problem was proposed by S. Iwamatsu in Japanese Pat Appln. (Kokai) No. 56-125,846, filed Mar. 7, 1980 and published Oct. 2, 1981. At that time, the state of the art in MOSFET technology used gate lengths of several micrometers. Hot carrier aging was not then a problem because hot carriers were not generated in the relatively long gate-length devices of that period. Iwamatsu addresses instead the problem of dangling bonds, explaining that the Si—SiO$_2$ system has a constant electric charge due to unsaturated bonds at the interface. Because of the presence of interfacial level density Qss developed at the interface under the influence of this charge, it is difficult to set a low threshold voltage in MOSFET devices. Iwamatsu proposes to implant carbon into the silicon substrate through the gate oxide layer followed by heat treatment in a hydrogen atmosphere. So far as known by applicants, this technique has not been adopted commercially and appears to have given way to the conventional use of hydrogen alone, as discussed above, to saturate silicon bonding locations at the oxide silicon interface. This practice, however, as applied in the current state of the art, turns out to be one of the preconditions for hot-carrier trapping in short gate-length MOS devices.

Accordingly, a need remains for a better technique for suppressing hot-carrier aging in near-micrometer and submicrometer MOSFET devices and the like.

SUMMARY OF THE INVENTION

One object o the invention is to improve longterm reliability of very large-scale integrated (VLSI) circuits without reducing operating drain voltages.

Another object is to reduce hot-carrier aging effects in short-channel MOSFET devices designed and operated in such circuits under conditions in which impact ionization is likely to occur.

A further object of the invention as aforementioned is to minimize time-dependent threshold shift in such devices.

An additional object is to attain the foregoing objects without materially complicating the process for fabrication of such devices and circuits.

The invention is a hot-electron aging-resistant metal-oxide-silicon field effect transistor (MOSFET) and a process for fabrication of such devices in an integrated circuit on a silicon substrate having an upper substrate surface. A gate oxide layer on a first portion of the substrate and forms an oxide-silicon interface at the substrate surface. A conductive gate contact is formed over the gate oxide. Conductive source and drain contacts are formed on second and third portions of the substrate on opposite sides of the gate oxide layer. A channel diffusion of dopant impurities in the first portion of the substrate under the gate oxide defines a threshold voltage of the transistor. Source and drain diffusions of dopant impurities in the second and third portions of the substrate, respectively, are arranged to define a channel length such that hot carriers are generated in the first portion of the silicon substrate under normal operating conditions. In other words, the source and drain diffusions are spaced so that field strength in the channel is sufficient to create impact ionization producing hot carriers, typically a field strength of at least $10^5$ volts per centimeter. The first portion of the silicon substrate is doped with carbon atoms in a concentration of at least $1E16/cm^3$ at the silicon-oxide interface, preferably in a concentration range of $1E16/cm^3$ to $1E20/cm^3$, so that trapping of the hot carriers at the interface is suppressed to minimize threshold voltage shift over time.

According to one embodiment of the invention, the carbon atoms are implanted or diffused into a shallow layer of the substrate immediately beneath the substrate surface. In another embodiment, the entire substrate is doped with carbon atoms. The oxide-silicon interface can include hydrogen atoms, in which case a substantial portion of the hydrogen atoms are bonded to carbon atoms. Carbon has a higher bonding strength to hydrogen than does silicon so hot electrons are less likely to dissociate the hydrogen from carbon atoms at the interface and form hot carrier trapping sites.

The invention is most applicable to MOSFET devices in which the channel length is less than 2 micrometers. When the channel length is one micrometer or less, a device according to the invention built to operate normally at $V_D = V_G = 5.0$ volts has a threshold shift of less than 70 millivolts at an aging time of 24 hours when operated at a drain-to-source voltage $V_D$ of 7.0 volts and a gate voltage $V_G$ of 2.5 volts.

The foregoing and other objects, features and advantages of the invention will become more readily apparent from the following detailed description of a preferred embodiment which proceeds with reference to the drawings.

DETAILED DESCRIPTION

Figure 1:
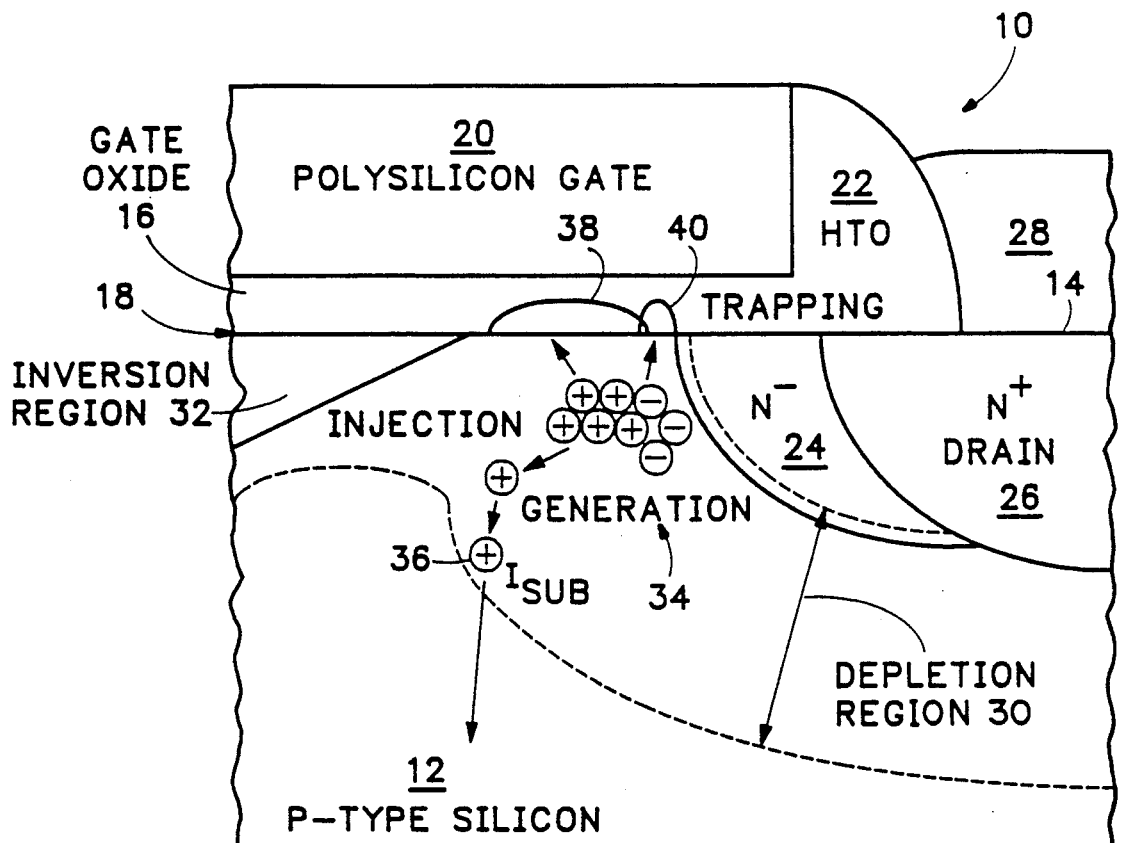
FIG. 1 is a cross-sectional view of a metal-oxide-silicon field effect transistor (MOSFET) illustrating hot carrier effects including hot carrier generation, injection and trapping.

The invention can be implemented in an integrated circuit comprising a plurality of metal-oxide-silicon field effect transistor (MOSFET) devices fabricated by otherwise conventional processes, such as that shown in FIG. 1. Although the invention is illustrated in connection with an N-type (NMOS) FET device, it may be used in PMOS FET device technology as well.

Referring to FIG. 1, a near-micrometer or submicrometer N-channel MOSFET device is formed on a P-type silicon substrate 12 having an upper substrate surface 14. A gate oxide layer 16 is conventionally formed, preferably by thermal oxidation, on a first portion of the substrate. The oxide layer contacts the substrate silicon and forms an oxide-silicon interface 18 at the substrate surface. Prior to forming the oxide layer, a channel diffusion is formed, preferably by low-dosage ion implantation of boron dopant impurities, in the first portion of the substrate under the gate oxide. This implant is diffused during thermal oxidation to form the gate oxide and serves to define an initial threshold voltage of the transistor, conventionally set at about 0.7 volts. A conductive gate contact layer 20 is deposited and patterned to overlie the gate oxide. This layer can be formed by depositing, patterning and doping a polysilicon layer, or by metal deposition and patterning. A sidewall spacer 22 is formed on both sides of the gate structure 16, 20, conventionally by deposition and anisotropic reactive ion etching.

The gate structure and sidewall spacer serve as a self-aligning mask for implanting an N-type drain diffusion in an exposed portion of the substrate on one side of the gate structure and a similar source diffusion (not shown) on the opposite side of the gate structure. Optionally, this diffusion can be formed in two steps: first, an N- diffusion 24 prior to forming the sidewall spacer and, second, an N+ diffusion after forming the spacer. These diffusions are preferably formed by ion implantation, with the gate structure alone serving as a mask for the N- implant and the gate structure and spacer serving as a mask for the N+ implant. Subsequent heat treatment diffuses the implants downward and laterally a short distance beneath the gate structure and sidewall spacer.

A conductive (metal, e.g., Al) drain contact 28 is deposited over the exposed portion of the substrate containing the drain diffusion and a similar contact is deposited on an opposite side of the gate oxide layer, both in contact with the substrate silicon surface 14. The final device is conventionally annealed in a hydrogen atmosphere. Hydrogen atoms permeate through the gate structure and bond to dangling silicon bonds at the oxide-silicon interface.

In conventional operation of near-micrometer (less than 2 micrometers) and submicron gate-length devices, a depletion region 30 forms between the N-type and P-type regions of the substrate. When a sufficient positive bias is applied to the gate 20, an inversion layer 32 forms in the P- region, forming an N-type conduction path or channel beneath the gate oxide 16. The spacing between the source and drain diffusions defines a channel length of the MOSFET device. A micrometer-sized device, having a drawn gate length of 1.0 micrometer, typically has an effective channel length of about 0.8 micrometer.

In the context of the present invention, the source and drain diffusions are spaced such that hot carriers 34 (electron and hole pairs) are generated by impact ionization of drain current carriers in a high electric field (field strength at least $10^5$ volts per centimeter) region of the channel adjacent the drain diffusion. Some carriers (holes 36) are ejected from the depletion region as a parasitic substrate current $I_{sub}$. Other carriers are injected into the oxide-silicon interface under the gate oxide layer. In conventional devices, the latter carriers are trapped at the oxide-silicon interface and form cumulative charges of holes 38 and electrons 40. The net cumulative trapped charge eventually becomes dominated by electrons, forming a net potential at the interface which offsets the electric field induced by the potential applied to the gate 20. The net effect is to shift the threshold voltage at which conduction through the inversion channel commences.

In conventional micrometer-sized devices, a threshold voltage initially set at about 0.7 volts will commonly shift by 200 to 300 millivolts over time, changing the threshold voltage to about 0.9 to 1.0 volts. In a circuit designed efficiently to operate at a drain voltage $V_D$ of 5 volts and a gate voltage $V_G$ of 2.5 volts, this much shift can disrupt proper circuit operation after an aging period that is unacceptably short. This aging period varies, depending on the rate of hot carrier generation, which depends on the drain field being sufficient to cause impact ionization—ultimately a function of gate length.

Figure 2:
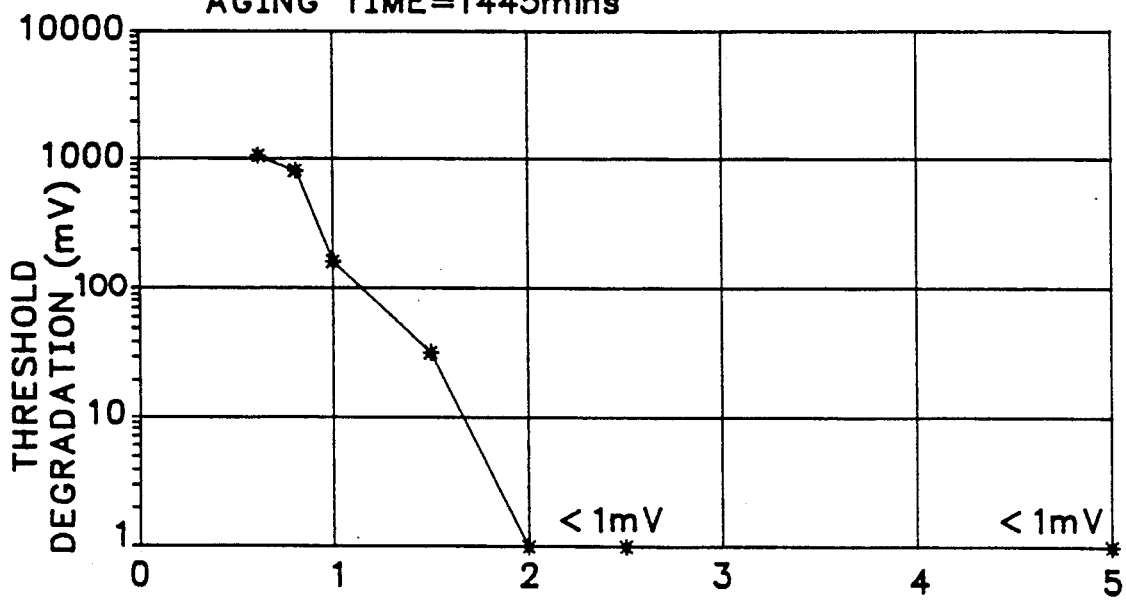
FIG. 2 is a semilogarithmic graph of threshold degradation vs. MOS gate length due to hot carriers.

FIG. 2 shows the dependence of aging (threshold degradation) on MOS gate length after a 24 hour (1445 minutes) period of operation of conventional lightly-doped-drain (LDD) MOSFET devices under standard test conditions of $V_D=7.0$ volts, $V_G=2.5$ volts. Data points along the abscissa for gate lengths of 2.5 micrometers and 5 micrometers indicate a threshold shift of less than one millivolt—i.e., below the measurable limits—consistent with experience prior to the advent of short gate-length MOSFET devices. A data point at 2.0 micrometers indicates a threshold shift of one millivolt. From that point, threshold shift increases exponentially as gate length shortens 33 mV at 1.5 micrometers; 160 mV at 1.0 micrometer; over 800 mV at 0.8 micrometer; and over one volt at 0.6 micrometer.

The present invention greatly reduces hot carrier trapping by reducing trapping sites without materially altering conventional fabrication processing. This is accomplished by doping the first portion of the silicon substrate, which underlies the gate oxide 16, with carbon atoms in a concentration of at least $1E16/cm^3$ at the oxide-silicon interface 18, preferably in a concentration range of $1E16/cm^3$ to $1E20/cm^3$. This has been done two different ways. Both techniques have proven equally successful in suppressing the trapping of the hot carriers at the silicon-oxide interface and minimizing threshold voltage shift over time. In the first approach, carbon atoms are implanted or diffused into a shallow layer of the substrate silicon immediately beneath the substrate surface. This is preferably done prior to forming the oxide layer 16. The second approach simply uses a silicon substrate that is entirely carbon-doped when the crystal from which the wafer is cut is being grown.

Figure 3:
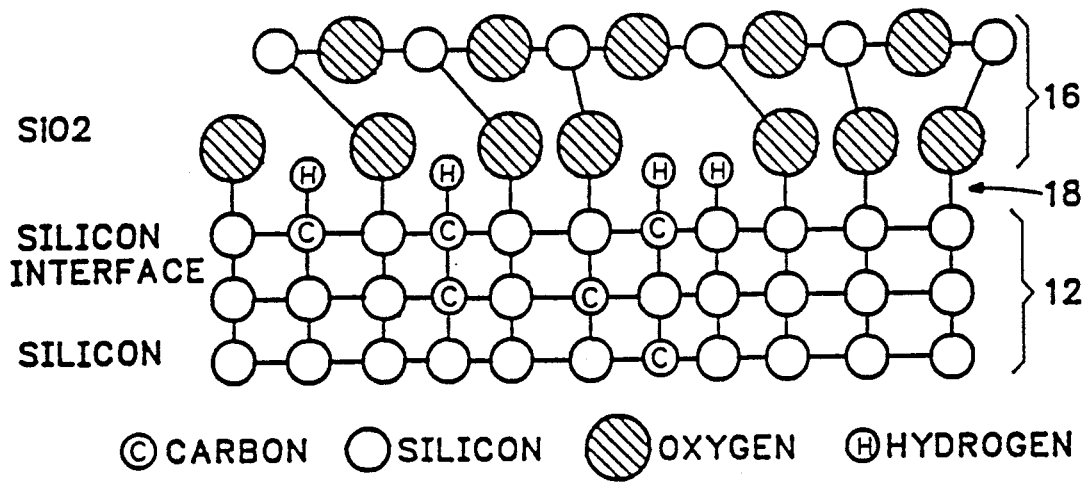
FIG. 3 is a diagram of an enlargement of a portion of the gate oxide-silicon interface lattice structure of a submicrometer MOSFET device like that of FIG. 1 processed in accordance with the invention.

FIG. 3. depicts the silicon-oxide interface structure of a MOSFET device when carbon doped in accordance with the invention. Carbon atoms covalently bond in various sites in the silicon lattice 12 near interface 18, and may also persist in sites in the oxide layer 16. Dangling bonds at the oxide-silicon interface are saturated by hydrogen atoms. In conventional devices lacking the carbon atoms, essentially all of the hydrogen atoms would be bonded to silicon atoms and, because of relatively low bond strength, many of the hydrogen-silicon bonds would be disrupted by hot carriers and the hydrogen atoms replaced by a trapped carrier. The bonding strength of carbon to hydrogen is greater than that of silicon, sufficiently so that nearly all hydrogen atoms are retained at the interface so that trapping sites remain permanently saturated.

Figure 4:
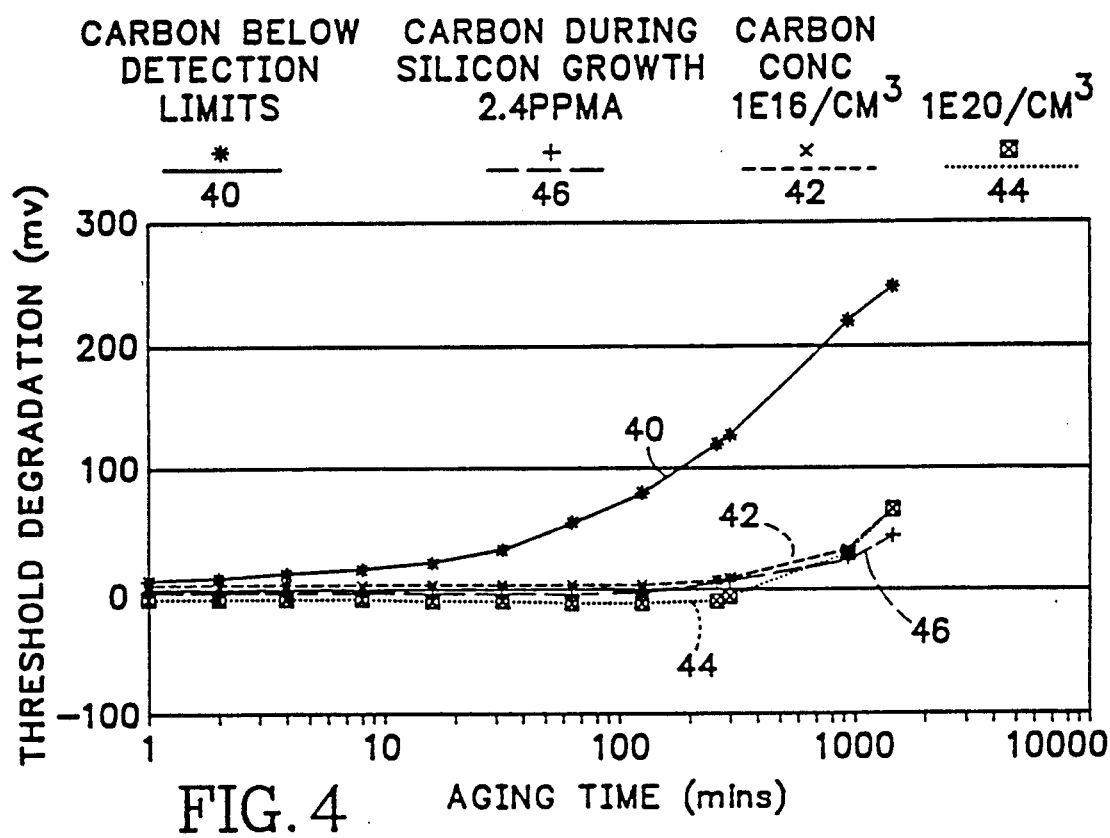
FIG. 4 is graph of threshold degradation vs. aging time comparing results of examples of submicrometer devices processed in accordance with the invention with results for a control example.

FIG. 4 compares aging characteristics over a 24-hour period of three examples of devices made according to the invention with a control example. The following test conditions apply to each example:

Lot 47T05 N-channel devices, W/L=50/1 microns

No passivation/anneal, Oxide thickness=200 Angstroms

Stress conditions $V_D=7.0$ volts, $V_G=2.5$ volts

All four examples were micrometer-sized MOSFET devices made in the same wafer lot, according to the same basic fabrication process steps and conditions except as next described. The control example, for which results are indicated by data points on curve 40, was made without any detectable carbon in the substrate. According to a first example of the invention, wafer 13, for which results are indicated by data points on curve 42, was made with an additional step of shallow (20 KeV) implantation $1E16/cm^3$ carbon atoms into the substrate before forming the gate oxide layer. Wafer 29, for which results are indicated by data points on curve 44, was made as a second example in the same manner as wafer 13 but with a carbon implant dose of $1E20/cm^3$. A third example was made without a separate carbon implantation step but substituted a wafer which was doped with carbon during silicon growth in a concentration of 2.4 parts per million on curve 46. All four examples were tested under the same test conditions: $V_D=7.0$ volts, $V_G=2.5$ volts. These conditions are more severe than the usual operating conditions for such devices, which were designed to operate at $V_D=V_G=5.0$ volts.

The curve 40 for the control example exhibits a typical characteristic of hot carrier aging of conventional short-channel MOSFET devices. It rises sharply at first (200 millivolts in 1,000 minutes) and then gradually decreases in slope in a rising exponential curve as hot electron trapping sites are filled. At the end of 24 hours, the threshold shift for the control is 240 millivolts.

All three examples according to the invention exhibit aging characteristics that are quite similar to one another but strikingly different from that of the control example. Threshold shift occurs more gradually, no more than 10 millivolts after five hours, 30 millivolts in 15 hours, and 60 millivolts in 24 hours. In continued operation over a longer period, threshold shift of such devices levels off at about 75-100 millivolts With optimization of the process according to the invention, further reductions in threshold shift are expected.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. In an integrated circuit, a hot-electron aging-resistant metal-oxide-silicon field effect transistor (MOSFET) comprising:

a silicon substrate having an upper substrate surface;

a gate oxide layer covering a first portion of the substrate and forming an oxide-silicon interface at the substrate surface;

a conductive gate contact overlying the gate oxide;

a conductive source contact covering a second portion of the substrate on one side of the gate oxide layer;

a conductive drain contact covering a third portion of the substrate on an opposite side of the gate oxide layer;

a channel diffusion of dopant impurities in the first portion of the substrate under the gate oxide defining a threshold voltage of the transistor;

source and drain diffusions of dopant impurities in the second and third portions of the substrate, respectively;

the source and drain diffusions being spaced so that field strength in the drain is at least $10^5$ volts per centimeter such that hot carriers are generated in the first portion of the silicon substrate; and the first portion of the silicon substrate being doped with carbon atoms in a concentration of at least $1E16/cm^3$ at the interface so that trapping of the hot carriers at the interface is suppressed and a shift in the threshold voltage over time is minimized.

2. An integrated circuit device according to claim 1 in which the first portion of the silicon substrate is doped with carbon atoms in a concentration range of $1E16/cm^3$ to $1E20/cm^3$.

3. An integrated circuit device according to claim 1 in which the source and drain diffusions are spaced so that field strength in the channel is sufficient to create impact ionization producing hot carriers.

4. An integrated circuit device according to claim 1 in which the source and drain diffusions are spaced so that the channel length is one micrometer or less.

5. In an integrated circuit, a hot-electron aging-resistant metal-oxide-silicon field effect transistor (MOSFET) comprising:

a silicon substrate having an upper substrate surface;

a gate oxide layer covering a first portion of the substrate and forming an oxide-silicon interface at the substrate surface;

a conductive gate contact overlying the gate oxide;

a conductive source contact covering a second portion of the substrate on one side of the gate oxide layer;

a conductive drain contact covering a third portion of the substrate on an opposite side of the gate oxide layer;

a channel diffusion of dopant impurities in the first portion of the substrate under the gate oxide defining a threshold voltage of the transistor; and source and drain diffusions of dopant impurities in the second and third portions of the substrate, respectively;

the diffusions being arranged to define a channel length such that hot carriers are generated in the first portion of the silicon substrate;

the first portion of the silicon substrate being doped with carbon atoms in a concentration of at least $1E16/cm^3$ at the interface so that trapping of the hot carriers at the interface is suppressed and a shift in the threshold voltage over time is minimized;

the carbon atoms being implanted or diffused into a shallow layer of the substrate immediately beneath the substrate surface.

6. An integrated circuit device according to claim 1 in which the entire substrate is doped with said carbon atoms.

7. An integrated circuit device according to claim 1 in which the oxide-silicon interface includes hydrogen atoms, a portion of which are bonded to the carbon atoms.

8. In an integrated circuit, a hot-electron aging-resistant metal-oxide-silicon field effect transistor (MOSFET) comprising:

a silicon substrate having an upper substrate surface;

a gate oxide layer covering a first portion of the substrate and forming an oxide-silicon interface at the substrate surface;

a conductive gate contact overlying the gate oxide;

a conductive source contact covering a second portion of the substrate on one side of the gate oxide layer;

a conductive drain contact covering a third portion of the substrate on an opposite side of the gate oxide layer;

a channel diffusion of dopant impurities in the first portion of the substrate under the gate oxide defining a threshold voltage of the transistor;

source and drain diffusions of dopant impurities in the second and third portions of the substrate, respectively;

the source and drain diffusions being spaced so that the channel length is one micrometer or less such that hot carriers are generated in the first portion of the silicon substrate; and the first portion of the silicon substrate being doped with carbon atoms in a concentration of at least $1E16/cm^3$ at the interface so that trapping of the hot carriers at the interface is suppressed and a shift in the threshold voltage over time is minimized such that the transistor has a threshold shift of less than 70 millivolts at an aging time of 24 hours at a drain-to-source voltage of 7 volts and a gate voltage of 2.5 volts.

9. In an integrated circuit, a hot-electron aging-resistant metal-oxide-silicon field effect transistor (MOSFET) prepared by a process comprising the steps of:

providing a silicon substrate having an upper substrate surface;

forming a gate oxide layer over a first portion of the substrate with an oxide-silicon interface at the substrate surface;

forming a conductive gate contact over the gate oxide;

forming a conductive source contact over a second portion of the substrate on one side of the gate oxide layer and a conductive drain contact over a third portion of the substrate on an opposite side of the gate oxide layer;

forming a channel diffusion in the first portion of the substrate under the gate oxide to define a threshold voltage of the transistor and source and drain diffusions in the second and third portions of the substrate, respectively;

the source and drain diffusions being spaced so that field strength in the drain is at least $10^5$ volts per centimeter such that hot carriers are generated in the first portion of the silicon substrate; and the first portion of the silicon substrate being doped with carbon atoms in a concentration of at least $1E16/cm^3$ at the interface so that trapping of the hot carriers at the interface is suppressed and a shift in the threshold voltage over time is minimized.

10. An integrated circuit device according to claim 9 in which the carbon atoms are implanted or diffused into a shallow layer of the substrate immediately beneath the substrate surface.

11. An integrated circuit device according to claim 9 in which the entire substrate is doped with said carbon atoms.

12. An integrated circuit device according to claim 9 in which the source and drain diffusions are spaced so that the channel length is one micrometer or less and the transistor has a threshold shift of less than 70 millivolts at an aging time of 24 hours at a drain-to-source voltage of 7 volts and a gate voltage of 2.5 volts.

13. An integrated circuit device according to claim 5 in which the first portion of the silicon substrate is doped with carbon atoms in a concentration range of $1E16/cm^3$ to $1E20/cm^3$.

* * * * *